United States Patent [19]

Harada et al.

[11] 4,452,720

[45] Jun. 5, 1984

[54] FLUORESCENT COMPOSITION HAVING THE ABILITY TO CHANGE WAVELENGTHS OF LIGHT, SHAPED ARTICLE OF SAID COMPOSITION AS A LIGHT WAVELENGTH CONVERTING ELEMENT AND DEVICE FOR CONVERTING OPTICAL ENERGY TO ELECTRICAL ENERGY USING SAID ELEMENT

[75] Inventors: Toshiaki Harada; Toshiyuki Hiramatsu; Teizo Yamaji, all of Iwakuni, Japan

[73] Assignee: Teijin Limited, Osaka, Japan

[21] Appl. No.: 270,022

[22] Filed: Jun. 3, 1981

[30] Foreign Application Priority Data

| Jun. 4, 1980 | [JP] | Japan | 55-74180 |
|---|---|---|---|
| Jul. 15, 1980 | [JP] | Japan | 55-95595 |
| Jul. 21, 1980 | [JP] | Japan | 55-98633 |
| Jul. 21, 1980 | [JP] | Japan | 55-98634 |
| Jul. 28, 1980 | [JP] | Japan | 55-102357 |
| Aug. 19, 1980 | [JP] | Japan | 55-112955 |
| Aug. 20, 1980 | [JP] | Japan | 55-113364 |

[51] Int. Cl.³ .................. C09K 11/02; G01T 1/10
[52] U.S. Cl. ............................................. 252/301.16
[58] Field of Search .................. 52/301.21, 301.16

[56] References Cited

U.S. PATENT DOCUMENTS

| 3,912,931 | 10/1975 | Gravisse et al. | 250/458 |
|---|---|---|---|
| 4,110,123 | 8/1978 | Goetzberger et al. | 136/247 |
| 4,140,544 | 2/1979 | Sill | 136/247 |
| 4,153,813 | 5/1979 | Blieden et al. | 136/247 |
| 4,155,371 | 5/1979 | Wohlmut et al. | 136/247 |
| 4,164,532 | 8/1979 | Boling | 136/247 |
| 4,173,495 | 11/1979 | Rapp et al. | 136/259 |

FOREIGN PATENT DOCUMENTS

| 2139689 | 8/1971 | Fed. Rep. of Germany | 252/301.21 |
|---|---|---|---|
| 1563068 | 4/1969 | France | 252/301.21 |
| 2031276 | 11/1970 | France | 252/301.21 |
| 16301 | 4/1974 | Japan. | |
| 94345 | 8/1977 | Japan. | |
| 12953 | 2/1978 | Japan. | |
| 120760 | 10/1978 | Japan. | |
| 127945 | 10/1979 | Japan. | |
| 1270107 | 4/1972 | United Kingdom | 252/301.21 |

OTHER PUBLICATIONS

Rapp and Boling, 13th Photovoltaic Specialists Conference, "Luminescent Solar Concentrators", 1978 p. 690.

Swartz, Cole and Zewall, Optics Letters, "Photon Trapping and Energy Transfer in Multiple-Dye Plastic Matrices: An Efficient Solar-Energy Concentrator," vol. 1, 1977, p. 73.

Primary Examiner—F. Edmundson
Attorney, Agent, or Firm—Sherman & Shalloway

[57] ABSTRACT

A fluorescent composition consisting essentially of
(1) a polymer having a solubility parameter of at least about 9 such as polyethylene terephthalate etc. and
(2) one or more organic fluorescent substances, at least one of said fluorescent substances showing difficult solubility such as anthraquinonic pigments, said fluorescent composition being characterized by the fact that when it is formed into a film having a thickness of about 1 mm, the film has a non-transmission index PTi (%), as defined by the following equation, of not more than 10, $$PTi = PAs - PAb$$

wherein PAs is the percent light absorption at 800 nm of said film of the fluorescent composition, and PAb is the percent light absorption at 800 nm of a film having a thickness of about 1 mm of the polymer in the fluorescent composition.

Preferably, the composition is of a non-radiation type and contains at least two organic fluorescent substances, at least one of which shows difficult solubility, and at least two of which are such that the emission spectrum of one organic fluorescent substance has a wavelength common to the absorption spectrum of another organic fluorescent substance.

A shaped article composed of the composition is useful for light wavelength conversion.

16 Claims, No Drawings

FLUORESCENT COMPOSITION HAVING THE ABILITY TO CHANGE WAVELENGTHS OF LIGHT, SHAPED ARTICLE OF SAID COMPOSITION AS A LIGHT WAVELENGTH CONVERTING ELEMENT AND DEVICE FOR CONVERTING OPTICAL ENERGY TO ELECTRICAL ENERGY USING SAID ELEMENT

This invention relates to a fluorescent composition having the ability to change the wavelengths of light, a shaped article of said composition as a light wavelength converting element, and a device for converting optical energy to electrical energy using said element.

More specifically, this invention pertains to a fluorescent composition capable of changing wavelengths of light which has the ability to absorb light over a broad wavelength region and to release light having a longer wavelength than the absorbed light; a shaped article of the fluorescent composition; and to a device for converting optical energy to electrical energy using said shaped article.

It is well known that in nature and in industrial fields, an optical energy of sunlight or artificial light is utilized after converting it to a chemical or electrical energy. For example, plants absorb light to perform photosynthesis whereby development and differentiation take place. In industrial fields, various devices utilizing optical energy such as solar cells or light utilizing hydrogen producing devices are known.

It is also well known that for absorption and utilization of optical energy, light within a specified wavelength region is effective. Thus, there have been proposed colored agricultural films which permit selective transmission of light within a specified wavelength region from sunlight while absorbing and removing light in the unwanted wavelength regions, and solar cells which have an increased efficiency of utilizing sunlight as a result of using a fluorescent substance having an absorption spectrum within a specified wavelength region.

For example, Japanese Patent Publication No. 16,301/1974 and Japanese Laid-Open Patent Publication No. 94345/1977 disclose agricultural films containing a fluorescent substance such as 2,4-di(5-tert.butyl-2-benzoxazolyl)thiophene known as a so-called fluorescent bleaching agent. These agricultural films absorb ultraviolet light (not more than about 380 nm) having a shorter wavelength than visible light and convert it to light of a wavelength region required for the growth of plants (420–460 nm). They, however, have the defect that these fluorescent substances have poor light resistance, and generally decompose in several weeks upon outdoor exposure to sunlight, thus losing their ability to emit fluorescence.

Japanese Laid-Open Patent Publication No. 127,945/1979 discloses an agricultural sheet containing a fluorescent dye such as Rhodamine 6G, which absorbs visible light of a relatively short wavelength and converts it to light having a wavelength of 630 to 680 nm. This agricultural sheet is neither feasible in practical applications because of the poor light resistance of the fluorescent dye.

In the field of solar cells, the use of plastic sheets or films containing fluorescent dyes such as Coumarin 6 or Rhodamine 6G as a light wavelength-converting element was proposed (see 13th Photovoltaic Specialist's Conference, 1978, page 690 and Optics Letters Vol. 1, page 73, 1977).

U.S. Pat. No. 3,912,931 discloses a light wavelength converting element for solar cells which is composed of a laminate of plastic different sheets having different fused aromatic ring compounds such as anthracene, naphthacene and pentacene which are molded from resin compositions consisting of a silicone resin and the fused aromatic ring compounds. According to this light wavelength-converting element, fluorescence emitted from a first sheet containing a first fused aromatic ring compound is converted to another fluorescence by being changed in wavelength in a second sheet containing a second fused aromatic ring compound, and in this way, wavelength conversion can be successively effected. Hence, light of a broad range of wavelengths can be converted to light of a wavelength effective for solar cells. However, these fused aromatic ring compounds do not have sufficient light resistance and their service life is not so long.

As stated hereinabove, conventional agricultural films for wavelength conversion and conventional light wavelength converting elements for solar cells do not have sufficient light resistance for practical applications. In order to produce agricultural films or light wavelength converting elements for solar cells which have sufficient light resistance in practical applications and an excellent efficiency of light wavelength conversion, it is at least necessary that fluorescent substances having high light resistance should be used and that these fluorescent substances should dissolve in a substrate in the optically fully dispersed state. To the best of the knowledge of the present inventors, there has been no suggestion about light wavelength converting elements consisting of a substrate and a fluorescent substance having high light resistance and being optically fully dispersed therein.

Japanese Laid-Open Patent Publication No. 12953/1978 proposed a colored aromatic polyester containing C. I. Vat Red 15 having the following formula:

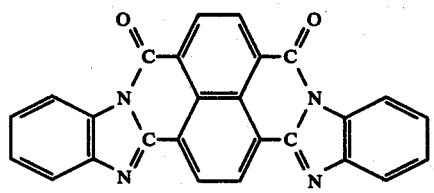

Japanese Laid-Open Patent Publication No. 120760/1978 proposed a colored aromatic polyester containing a specified substituted thioindigo pigment represented by the following general formula

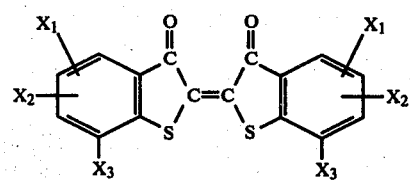

wherein $X_1$ and $X_2$ represent a hydrogen or chlorine atom or a methyl group and $X_3$ represents a chlorine atom or a methyl group.

Example 1 in both of these two Japanese patent documents describes filaments obtained by dry-blending polyethylene terephthalate and a pigment and melt-spinning the mixture, and it is stated that the presence of pigment particles in these filaments was not observed at all by a 400X microscope. Thus, these two Japanese Patent documents relate to so-called dope-dyed polyesters, and not to a resin composition intended for light wavelength conversion. In other words, these patent documents neither disclose nor suggest the possibility of light wavelength conversion. Investigations of the present inventors have shown that for light wavelength conversion, polyethylene terephthalate and the pigment should be mixed carefully and intimately so that the pigment is optically fully dispersed, and that for example, even dope-dyed polyethylene terephthalate having satisfactory coloration and being free from pigment particles by observation with a 400X microscope is not necessarily satisfactory as a composition having a sufficient efficiency of light wavelength conversion, as will be shown hereinbelow in a comparative example.

Japanese Laid-Open Patent Publication No. 75480/1980 discloses a fluorescent collector containing a dye of the following formula

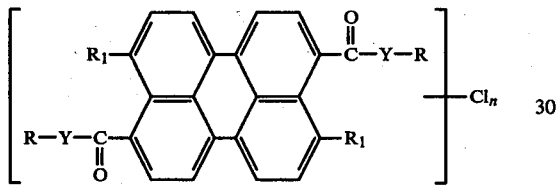

wherein R represents a hydrogen atom or an optionally substituted hydrocarbon or heterocyclic group, Y represents an oxygen atom or —NR, $R_1$ represents a hydrogen atom or

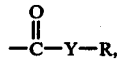

and n is 0 or an integer of 1 to 16; provided that when $R_1$ represents

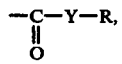

the groupings

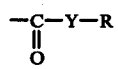

at the peri-position may be bonded to each other to form a cyclic imide or carboxylic anhydride structure. However, this patent document does not specifically describe a fluorescent collector having a polymer substrate, much less a method for producing a fluorescence collector having a polymer substrate.

It is an object of this invention to provide a fluorescent composition which shows an excellent efficiency of light wavelength conversion and excellent light resistance.

Another object of this invention is to provide a homogeneous fluorescent composition consisting of a polymer having a relatively high molecular cohesive force and a relatively difficulty-soluble organic fluorescent substance dispersed therein optically fully.

Still another object of this invention is to provide a fluorescent composition having excellent light resistance and an excellent efficiency of light wavelength conversion which contains a relatively difficulty-soluble organic fluorescent substance and another organic fluorescent substance having an absorption spectrum with wavelengths common to the emission spectrum of the first organic fluorescent substance, the light emitted by the relatively difficulty-soluble organic fluorescent substance being non-radiatingly absorbed by the other organic fluorescent substance.

Yet another object of this invention is to provide a shaped article of the aforesaid fluorescent composition of the invention as a light wavelength conversion element.

A further object of this invention is to provide a device for converting optical energy to electrical energy composed of said light wavelength converting element and a solar cell optically coupled thereto.

Other objects and advantages of the invention will become apparent from the following description.

According to this invention, these objects and advantages are achieved firstly by a fluorescent composition which is characterized in that (A) it consists essentially of (1) a polymer having a solubility parameter of at least about 9, and
(2) one or more organic fluorescent substances, at least one of said fluorescent substances showing difficult solubility such that when 0.5 part by weight of said at least one fluorescent substance and 100 parts by weight of polypropylene are mixed in the molten state at 300° C. for 10 minutes and formed into a film having a thickness of about 1 mm, the film has a non-transmission index $ETi$ (%), as defined by the following equation, of at least 7, $$ETi = EAs - EAB$$

wherein $EAs$ is the percent light absorption of said film at 800 nm, and $EAb$ is the percent light absorption at 800 nm of a film of polypropylene having a thickness of about 1 mm; and (B) that when it is formed into a film having a thickness of about 1 mm, the film has a non-transmission index $PTi$ (%), as defined by the following equation, of not more than 10, $$PTi = PAs - PAb$$

wherein $PAs$ is the percent light absorption at 800 nm of said film of the fluorescent composition, and $PAb$ is the percent light absorption at 800 nm of a film having a thickness of about 1 mm of the polymer in the fluorescent composition.

The polymer used in this invention has a solubility parameter of at least about 9. The solubility parameter, as used in this invention, is calculated by the method which Robert F. Fedors proposed in "Polymer Engineering and Science", February 1974, Vol. 14, No. 2, pages 147–154 and ibid., June 1974, Vol. 14, No. 6. In calculating the solubility parameter, however, the degree of crystallinity of the polymer is not taken into consideration.

Polymers having a solubility parameter of at least about 9 dissolve relatively difficulty-soluble organic fluorescent substances used in this invention in the optically well dispersed state to give fluorescent compositions of this invention having excellent light resistance.

The polymer used in this invention is selected preferably from polyesters, polyamides, polycarbonates, polyolefins, polysulfones, polysiloxanes and cellulose acetates. These polymers may be used singly or as a mixture of two or more.

Especially preferred polymers for use in this invention are given below (the parenthesized figures show solubility parameters).

Poly(methyl methacrylate) (9.5),
poly(methyl acrylate) (10.6),
poly(vinyl acetate) (10.0),
polystyrene (10.1),
polyvinyl chloride (9.4),
polyvinylidene chloride (10.2),
polyacrylonitrile (13.1),
cellulose diacetate (12.4),
cellulose triacetate (10.7),
polyethylene terephthalate (11.3),
polyethylene isophthalate (11.3),
polytrimethylene terephthalate (11.0),
polypropylene terephthalate (11.0),
polytetramethylene terephthalate (10.8),
polyhexamethylene sebacamide (10.8),
poly($\omega$-undecanamide) (10.1),
poly($\omega$-dodecanamide) (9.9),
polycarbonate derived from 2,2-bis(4-hydroxyphenyl)propane (9.9),
polyphenylmethylsiloxane (9.8), and
polydiphenylsiloxane (10.7).

In addition to the above thermoplastic polymers, curable polymers can also be used. Preferably, the curable polymers are photocurable or condensation-type thermosetting polymers. For example, there may be used photocurable polymers consisting mainly of the skeletons of the above exemplified thermoplastic polymers and containing functional groups which have the property of being crosslinked upon receiving light irradiation, such as a vinyl group, and condensation-type thermosetting resins such as novolak resins. The solubility parameter of such a photocurable polymer is calculated with respect to the thermoplastic polymer chain portion which constitutes its skeleton.

The polymer used in this invention has a solubility parameter of at least about 9. Polymers having a solubility of less than about 9 cannot dissolve the organic fluorescent materials used in this invention in the optically sufficiently dispersed state. Organic fluorescent substances such as fluorescent bleaching agents which can be dissolved in the polymers hving a solubility parameter of less than about 9 have previously been known, but the resulting resin compositions having such organic fluorescent substances dissolved therein have poor light resistance and do not serve for practical purposes.

Preferred polymers for use in this invention have a solubility parameter of about 9.5 to about 15. Especially preferred polymers are polyethylene terephthalate, polyethylene isophthalate, polypropylene terephthalate, and polycarbonate derived from 2,2-bis(4-hydroxyphenyl)propane.

The organic fluorescent substances used in this invention are characterized by their difficult solubility in polymers having a relatively small solubility parameter. The difficult solubility of the organic fluorescent substance used in this invention is defined by the fact that when 0.5 part by weight of the organic fluorescent substance and 100 parts by weight of polypropylene are mixed in the molten state at 300° C. for 10 minutes and formed into a film having a thickness of about 1 mm, the film has a non-transmission index ETi (%), as defined by the following equation, of at least 7.

$$ETi = EAs - EAb$$

wherein EAs is the percent light absorption at 800 nm of the above film containing the organic fluorescent substance, and EAb is the percent light absorption at 800 nm of a film of polypropylene having a thickness of about 1 mm.

In the above equation representing the non-transmission index ETi (%), EAb is a constant determined by the polypropylene used. Accordingly, as the ETi becomes larger, EAs becomes larger and the organic fluorescent substance is insoluble, or difficultly-soluble, in polypropylene.

Investigations of the present inventors have shown that difficultly-soluble organic fluorescent substances having a non-transmission index ETi of at least 7 can be dissolved in the optically sufficiently dispersed state in polymers used in this invention having a solubility parameter of at least about 9, thereby giving fluorescent compositions of this invention having excellent light resistance.

It has previously been known that a difficultly-soluble organic fluorescent substance exhibits excellent light resistance while it is dispersed in the polymer. It has however been not known that these organic fluorescent substances still show excellent light resistance while they are optically fully dispersed. It is indeed surprising that the difficultly-soluble organic fluorescent substances show such excellent light resistance in such a dispersed state in which they are very susceptible to influences of light.

Vat pigments, for example, are preferably used as the organic fluorescent substances in this invention. Examples of the vat pigments are anthraquinonic pigments, thioindigo pigments, perinone pigments and perylene pigments. Preferred anthraquinonic pigments are, for example, pyranthrone pigments, dibenzanthrone pigments, isodibenzanthrone pigments, dibenzopyrenequinone pigments and anthanthrone pigments.

Examples of these vat pigments are described, for example, in Temple C. Patton, PIGMENT HANDBOOK, Volume 1, 1973, John Wiley & Sons, pages 651–676; K. Vankataraman, The Chemistry of Synthetic Dyes, Volume 1, 1952, Academic Press Inc., pages 861–1193; and color Index, 2nd edition, Volume 2, 1956, page 2419.

Examples of vat pigments preferably used in this invention include pyranthrone pigments such as CI Vat Orange 9, CI Vat Orange 2 and CI Vat Orange 4; dibenzanthrone pigments such as CI Vat Blue 20, CI Vat Blue 19, CI Vat Blue 22 and CI Vat Green 12; isodibenzanthrone pigments such as CI Vat Violet 10, CI Vat Violet 1, CI Vat Violet 9 and CI Vat Green 1; dibenzopyrenequinone pigments such as CI Vat Yellow 4 and CI Vat Orange 1; anthanthrone pigments such as CI Vat Orange 3; thioindigo pigments such as CI Vat Red 1, CI Vat Red 2, CI Vat Violet 2, CI Vat Violet 3, CI Vat Red 41, CI Pigment Red 87, and CI Pigment Red 88; perinone pigments such as CI Vat Red 15, CI Vat Orange 7 and 12H-phthaloperin-12-one; and perylene pigments such as CI Vat Red 23, CI Vat Red 29 and CI Vat Red 32. The fluorescent substances used in this invention preferably have an ETi of about 7 to about 60%.

These organic fluorescent substances may be used singly or as a mixture of two or more, or together with another organic fluorescent substance having an ETi of less than about 7%.

The fluorescent composition of this invention consists of the above polymer having a solubility parameter of at least about 9 and at least one organic fluorescent substance having an ETi, as defined hereinabove, of at least about 7, in which the organic fluorescent substance is dissolved in the optically sufficiently dispersed state in the polymer. The optically sufficiently dispersed state of the organic fluorescent substance in the polymer in this invention is defined by the fact that when the fluorescent composition is formed into a film having a thickness of about 1 mm, the film has a non-transmission index PTi (%), defined by the following equation, of not more than about 10.

$$PTi = PAs - PAb$$

wherein PAs is the percent light absorption at 800 nm of the film of the fluorescent composition, and PAb is the percent light absorption at 800 nm of a film having a thickness of about 1 mm of the polymer used in the fluorescent composition, provided that $PAs \geq PAb$.

In the above equation representing the non-transmission index PTi (%), PAb is a constant determined by the polymer used. Accordingly, for a given polymer, as the PAs becomes smaller, PTi becomes smaller and the fluorescent substance is dissolved in the polymer in a more desirable state.

Preferably, the fluorescent composition of this invention has a PTi (%) of not more than about 8.

The fluorescent composition of this invention contains at least one organic fluorescent substance having an ETi of at least 7. Thus, by the number of the organic fluorescent substances contained, the fluorescent compositions of this invention can be classified into those containing only one kind of organic fluorescent substance and those containing two or more kinds of the organic fluorescent substance.

The fluorescent composition of this invention containing only one kind of organic fluorescent substance having an ETi of at least about 7 absorbs light within a specified wavelength region, converts it to light having a longer wavelength and emits it, according to the properties of the organic fluorescent substance. For example, when the organic fluorescent substance is CI Vat Orange 7, the fluorescent composition converts light having a wavelength of about 460 nm to light having a wavelength of about 550 nm.

The fluorescent compositions of the invention containing two or more organic fluorescent substances having an ETi of at least about 7 can be divided into those in which the emission spectrum of one organic fluorescent substance has a wavelength common to the absorption spectrum of another organic fluorescent substance, and those in which the emission spectrum of one organic fluorescent substance does not have a wavelength common to the absorption spectrum of another organic fluorescent substance.

The fluorescent composition of this invention containing two or more organic fluorescent substances in which the emission spectrum of one fluorescent substance and the absorption spectrum of another fluorescent substance have a common wavelength shows the optical property of converting optical energy within the wavelength region of the emission spectrum of one organic fluorescent substance to optical energy in the wavelength region of the emission spectrum of the other organic fluorescent substance. There are two embodiments of converting light energy. According to one embodiment, the optical energy in the wavelength region of the emission spectrum of one organic fluorescent substance is first changed to light of a longer wavelength, the light having a longer wavelength is absorbed by another organic fluorescent substance, which changes it to light of a still longer wavelength and emits it (radiation-type conversion). According to the other embodiment, one organic fluorescent substance does not convert light energy in the wavelength region of its emission spectrum but transfers it to another organic fluorescent substance while it is on the level of singlet energy, and the other organic fluorescent substance which has received the energy so transferred converts it to light of a longer wavelength and emits it (Foerster-type conversion or non-radiating conversion).

The efficiency of optical energy conversion of the entire composition is obtained as the product of the optical energy conversion efficiencies (the energy efficiency at the time of converting light of a short wavelength to light of a long wavelength ... fluorescent quantum yield) of the respective organic fluorescent substances. Accordingly, even when the energy transfer between the organic fluorescent substances is effected with an efficiency of 100%, the optical energy conversion efficiency of the radiation-type conversion is generally lower than in the case of the non-radiating conversion.

On the other hand, the non-radiating conversion shows a higher optical energy conversion efficiency because the optical energy of one organic fluorescent substance is transferred to the other organic fluorescent substance while the energy is singlet. For example, when light having a wavelength of about 460 nm is irradiated onto the fluorescent composition of this invention containing CI Vat Orange 7 (which absorbs light having a wavelength of about 460 nm and emits light having a wavelength of about 550 nm) and CI Vat Red 41 (which absorbs light having a wavelength of about 550 nm and emits light having a wavelength of about 590 nm) as organic fluorescent substances, light having a wavelength of about 590 nm can be obtained.

It will be understood from the foregoing description that in a fluorescent composition of this invention containing three organic fluorescent substances in which common wavelengths exist in the emission spectrum of a first organic fluorescent substance and the absorption spectrum of a second organic fluorescent substance and between the emission spectrum of the second organic fluorescent substance and the absorption spectrum of a third organic fluorescent substance, irradiation of light in the absorption spectrum wavelength region of the first organic fluorescent substance gives light having the emission spectrum wavelength region of the third organic fluorescent substance. It will be easily understood that light of a long wavelength can be obtained in the same way as above with regard to the fluorescent composition of the invention containing four or more organic fluorescent substances having the same relation as above between the absorption spectrum and the emission spectrum.

According to this invention there is similarly provided a fluorescent composition corresponding to a non-radiation type composition of the invention containing two or more organic fluorescent substances having a non-transmission index ETi (%) of at least about 7 in which a part of the organic fluorescent substances is replaced by an organic fluorescent substance having an ETi (%) value of less than about 7. Generally, many of fluorescent substances having an ETi (%) of less than about 7 have insufficient light resistance. However, in the case of the non-radiating type conversion, singlet energy transfer is effected. Hence, even when an organic fluorescent substance having an ETi of less than 7 is used, the light resistance of the composition as a whole can be maintained sufficiently high.

For example, a non-radiating type composition of this invention containing an organic fluorescent substance having an ETi (%) of at least about 7, which has an emission spectrum in the longest wavelength region among the organic fluorescent substances used exhibits excellent light resistance even when it jointly uses an organic fluorescent substance having an ETi (%) of less than about 7.

Examples of organic fluorescent substances having an ETi of less than about 7 include fluorescent bleaching agents, for example oxazoles such as 1,2-di(5-methylbenzoxazol-2-yl)ethylene, coumarins such as 4-methyl-7-hydroxycoumarin, naphthalimides such as N-methyl-4-acetylamino-1,8-naphthalimide, pyrazolines such as 2,3,5-triphenylpyrazoline, dihydropyrimidines such as 2,4,6-trimethyl-3,5-di(ethoxycarbonyl)-1,4-dihydropyrimidine, and thiazoles such as 1-phenyl-2-(benzothiazol-2-yl) ethylene; fluorescent dyes such as acridine yellow, acridine orange, fluorescein, uranine, eosine, erythrosine, phloxine, Rose Bengale, Rhodamine B, Rhodamine 6G, rosamine, tripaflavine, benzoflavin, thionine, safranine, phenosafranine, magdarared, resrufine and methylene blue; and fused aromatic ring compounds such as naphthalene, anthracene, phenanthrene, chrisene, pyrene, triphenylene, pentacene, pentha pentaphene, perylene, hexaphene, coronene, rubrene, dibenzocoronene, fluoranthene and there can also be used substances which emit fluorescence although they are not used as fluorescent bleaching agents, for example quinolines such as 8-aminoquinaldine, thiazoles such as 4-(4-ethoxyphenyl) thiazole, pyridines such as 4,5-diaminopyridine, oxazoles such as 2,5-diphenyloxazole, flavones such as 5,6-dimethoxy-3-hydroxyflavone, coumarins such as 5-hydroxycoumarine, acridines such as 3-amino-acridine, acridones such as acridone, xanthiones such as xanthione, and carbazoles such as carbazole.

In the other group of fluorescent composition of this invention containing two or more organic fluorescent substances, the emission spectrum of one organic fluorescent substance and the absorption spectrum of another organic fluorescent substance do not substantially have a common wavelength. These organic fluorescent substances have a non-transmission index ETi (%), as defined hereinabove, of at least about 7. In such a fluorescent composition of this invention, transfer of optical energy does not substantially occur between one organic fluorescent substance and another organic fluorescent substance either radiatingly or non-radiatingly. Accordingly, they are characteristic in that lights corresponding to the respective emission spectra of these organic fluorescent substances are obtained in accordance with the optical energy conversion efficiency.

As stated hereinabove, the fluorescent composition of this invention contains the polymer having a solubility parameter of at least about 9, at least one organic fluorescent substance having an ETi (%), as defined hereinabove, of at least about 7, and optionally at least one organic fluorescent substance having an ETi (%), as defined hereinabove, of at less than about 7.

The fluorescent composition of this invention may contain at least one organic fluorescent substance in a total concentration of preferably up to about 3% by weight, preferably up to about 2.5% by weight. If the concentration of the organic fluorescent substances in the composition is too high, the organic fluorescent substances tend to separate from a shaped article produced from the fluorescent composition, and its transparency is impaired. Furthermore, as a result of concentration quenching of the fluorescent substance, the quantum yield of emission tends to decrease. This is a difference between the composition of this invention and a merely colored composition.

Each of the organic fluorescent substances may be contained in an amount of preferably at least about 0.001% by weight, more preferably at least about 0.005% by weight, based on the fluorescent composition.

In a preferred aspect of this invention, the fluorescent composition contains at least two organic fluorescent substances. At least one of them has difficult solubility represented by a non-transmission index ETi (%), as defined above, of at least about 7. Two of these organic fluorescent substances are such that the emission spectrum of one organic fluorescent substance and the absorption spectrum of the other organic fluorescent substance have a common wavelength. The total concentration of the two or more organic fluorescent substances is not more than about 3% by weight based on the composition, and the concentration of each organic fluorescent substance is at least about 0.001% by weight based on the composition. Furthermore, the total concentration of any two organic fluorescent substances having the common wavelength (when there are three organic fluorescent substances, a first organic fluorescent substance, a second organic fluorescent substance having an emission spectrum with a wavelength common to the absorption spectrum of the first organic fluorescent substance, and a third organic fluorescent substance having an absorption spectrum with a common wavelength to the emission spectrum of the first organic fluorescent substance, the total concentration refers to both the total concentration of the first and second organic fluorescent substances and the total concentration of the first and third organic fluorescent substances; when four or more organic fluorescent substances are included in the same relation as above, the total concentration refers to each of the total concentrations of any two organic fluorescent substances) is at least about 0.004% by weight, preferably at least 0.01% by weight, based on the composition.

This preferred fluorescent composition of this invention is the non-radiating type composition mentioned above. It can convert light of a short wavelength to light of a relatively long wavelength, and exibit quite excellent light resistance.

In the preferred non-radiating type composition of this invention, one organic fluorescent substance and another organic fluorescent substance have a common wavelength so that the difference in maximum absorption wavelength between the emission spectrum of the one organic fluorescent substance and the absorption spectrum of the other organic fluorescent substance is not more than about 150 nm, especially not more than 110 nm, above all not more than 70 nm.

The homogeneous fluorescent composition of this invention can be produced by sufficiently mixing with stirring the polymer and the organic fluorescent substance at a temperature above the melting temperature of the polymer, preferably at about 10°—about 40° C. higher than the melting point of the polymer, if required in an inert atmosphere. The mixing time differs depending upon the particle size and the amount of the organic fluorescent substance used, the temperature of the polymer used, the melting temperature etc.

Preferably, the organic fluorescent substance is used in the form of the finest possible particles or powder, for example as particles having a size of about 0.01 to about 20 μm, preferably about 0.1 to about 10 μm. Stirring-mixing required to give the fluorescent composition of this invention generally tends to take a longer period of time as the solubility parameter of the polymer used is smaller and the organic fluorescent substances used have a higher ETi. A sufficient stirring-mixing time can be determined by repeated experiments. The stirring and mixing can be performed in the polymerization reactor or a melt-extruder, or by means of a calender ring, for example.

The fluorescent composition of this invention can also be produced by mixing predetermined amounts of a master polymer containing organic fluorescent substances in a concentration above the desired concentration with a polymer not containing an organic fluorescent substance in the molten state with stirring.

The fluorescent composition of this invention may also contain, as required, various additives such as heat stabilizers, antioxidants or ultraviolet absorbers provided that they are optically dispersed in the polymer.

According to this invention, a shaped article of the fluorescent composition of this invention is provided as a light wavelength converting element. This light wavelength converting element is provided in a form which extends longer in two directions than in one other direction, or extends longer in one direction than in other two directions. The form which extends longer in two directions than in one other direction is represented, for example, by a film or sheet. In this form, a dimension in one direction (thickness) is properly determined depending upon the end uses of the light wavelength converting element. Usually, a thickness of about 1 μm to about 10 mm is used advantageously.

The form which extends longer in one direction than in other two directions is represented, for example, by a fine filament or a rod. This form may be straight, or bent (in the form of a volute, a coil, a spiral, etc.). In this form, the area of a plane defined by the two directions is properly determined depending on the end uses of the light wavelength converting element, circular, elliptical or polygonal (triangular, tetragonal, etc.). Usually, these forms advantageously have an area of about $5 \times 10^{-3}$ to about $1 \times 10^4$ mm$^2$ which defines the aforesaid plane defined by the two directions.

Preferably, the light wavelength converting element of the invention is at least smooth at that surface from which light is taken in.

The light wavelength converting element of the invention in a form which extends longer in two directions than in other one direction (to be referred to as a planar article) is used in such a way that light is gathered from one of two opposing surfaces defined by the two longer extending directions and light having a changed wavelength is taken out from the other surface, or that light is received from one or both of two surfaces defined by the longer extending two directions and light having a changed wavelength is taken out from a surface crossing the aforesaid surface (for example from a surface in the thickness direction of the film). On the other hand, the light wavelength converting element of the invention in a form which extends longer in one direction than in two other directions (to be referred to as a linear article) is used in such a way that light is taken in from a surface (side surface) crossing a surface defined by the aforesaid two directions, and light having a changed wavelength is taken out from the surface defined by the two directions. When the light wavelength converting element is a planar article which is adapted to take out light having a changed wavelength from the surface in the thickness direction and when it is a linear article which is adapted to take out light having a changed wavelength from the surface defining its diameter, the ratio of the area of the surface from which light is taken in to that of the surface from which light is taken out can be set at about 10 or more, preferably about $10^2$ to $10^5$. As a result, the light which has been taken in can be collected, and light having a changed wavelength can be taken out in a stronger condition from a smaller area.

Advantageously, the light wavelength converting element of the invention is used as a planar article adapted to taking out light having a changed wavelength from a surface corresponding to its thickness.

The light wavelength converting element of the invention as a planar article can be used, for example, for agriculture, as solar cells, etc., and the light wavelength converting element of the invention as a linear article can be used, for example, in solar cells or, displays, etc. In order to transmit light, increase the effect of light collection or to perform reinforcement, a film, sheet or linear article of a polymer having good transparency can be optically laminated or coupled to a part of the light wavelength converting element of the invention according to the aforesaid uses. Or a reflecting surface for throwing back light to the light wavelength converting element may also be provided.

The light wavelength converting element of the invention is used in the various applications mentioned above. For example, a device for converting optical energy to electrical energy can be provided by optically coupling a solar cell to that surface of the element from which light is to be taken out. Optical coupling can be achieved by coupling the light wavelength converting element to the solar cell by means of a binder material whose refractive index is equal or close to those of the polymer forming the light-gathering surface of the light wavelength converting element and the polymer forming a protective layer of the solar cell or is between the refractive indices of the two polymers. For example, polymers, hydrocarbons, silicone oils, etc. can be used as the binder material.

Coupling of the light wavelength converting element to the solar cell is effected such that the area of that surface of the element from which light is taken out is made substantially equal to that of the area of that surface of the solar cell from which light is gathered, or the area of the former is made larger than the area of the latter so that the former surface covers the latter surface. The amount of light having a changed wavelength which the solar cell receives is larger when the two areas are different than when these areas are equal to each other.

Furthermore, the amount of light having a changed wavelength which the solar cell receives increases by providing a light reflecting surface on that surface of the light wavelength changing element which crosses the surface from which light is gathered.

Preferred solar cells are, for example, silicon solar cells (amorphous silicon solar cells or monocrystal silicon solar cell), cadmium sulfide solar cells, and gallium-arsenic solar cells. The silicon solar cells are especially preferred. It is known that these solar cells have the following maximum absorption wavelengths.

Amorphous silicon solar cells: about 580 nm
Monocrystal silicon solar cells: about 800 nm
Cadmium sulfide solar cells: about 600 nm
Gallium-arsenic solar cells: about 700 nm Specific embodiments of coupling of the light wavelength converting element to solar cells are disclosed in the specifications of U.S. Pat. Nos. 4,110,123 and 4,173,495. The disclosures of these patents are hereby cited as references.

For example, to one or both surfaces of a planar article composed of the fluorescent composition of this invention is optically coupled (laminated) a planar article composed of a material having a refractive index equal or approximate to the refractive index of the polymer used in the fluorescent composition, or conversely, the planar article composed of the fluorescent composition of this invention is optically laminated to one or both surfaces of the aforesaid planar article of the aforesaid material. Or a plurality of these planar articles may be alternately laminated optically in the above matter. A solar cell can be optically coupled to the laminated surface or the intersecting surface (side surface) of the light wavelength converting element of the invention so constructed. The effects which arise from these structures are disclosed in the specification of U.S. Pat. No. 4,173,495.

The following Examples illustrate the present invention further. In these example, all parts and percentages are by weight.

In the present invention, the "fluorescence spectrum" is measured by using a Dual Beam Difference Spectrofluorephotometer RF-520 (a product of Shimazu Seisakusho Co., Ltd.; the photomultiplier tube was the product R-928 of Hamamatsu TV Co., Ltd.).

The percentage absorption at 800 nm used to determine the "non-transmission index" is measured by using a Double Beam Spectrophotometer UV-200 (a product of Shimazu Seisakusho Co., Ltd.).

The "radiation energy spectrum" is measured by using a Spectroscopic Energy Distribution Recorder SRP 1465 (a product of Iio Electrical Co., Ltd.).

REFERENTIAL EXAMPLES 1 TO 13

One hundred parts of polypropylene (Norblen MA-3, a tradename for a product of Mitsubishi Petrochemical Co., Ltd.) and 0.5 part of each of the vat pigments shown in Table A below were dry-blended and formed at 300° C. for 10 minutes into a film having a thickness of about 1 mm. The ETi values of the films were measured, and are shown in Table A. All of these films showed an ETi value of more than 7, and the remaining of pigment particles was observed even with the naked eyes. No substantial fluorescence was noted.

TABLE A

| Run No. | Fluorescent substance | ETi (%) |
| --- | --- | --- |
| 1 | CI Vat Blue 20 | 30.1 |
| 2 | CI Vat Orange 9 | 41.3 |
| 3 | CI Vat Violet 10 | 33.7 |
| 4 | CI Vat Red 41 | 58.4 |
| 5 | CI Vat Red 1 | 14.9 |
| 6 | CI Pigment Red 88 | 40.3 |
| 7 | 12H-phthaloperin-12-one | 7.4 |
| 8 | CI Vat Orange 7 | 60.2 |
| 9 | CI Vat Red 15 | 50.3 |
| 10 | CI Pigment Red 123 | 60.8 |
| 11 | CI Pigment Red 179 | 58.1 |
| 12 | CI Pigment Red 149 | 55.9 |
| 13 | CI Pigment Red 189 | 49.7 |

EXAMPLE 1

One thousand parts of polyethylene terephthalate chips (Tetoron chips having [$\eta$], determined at 25° C. in o-chlorophenol in a concentration of 0.5 g/100 ml, of 0.65, a product of Teijin Limited) and 0.2 part of CI Vat Blue 20, a dibenzanthrone fluorescent substance, were dry-blended, and melted at 300° C. to form a polymer having the dibenzanthrone dissolved therein.

In a customary manner, an unstretched film having a thickness of 450 $\mu$m was formed from this polymer, and then stretched consecutively in the longitudinal and transverse directions at 85° C. at a stretch ratio of 3 to give a stretched film having a thickness of 50 $\mu$m. A 1 mm-thick film obtained from the above polymer had an absorption of 15.0% at 800 nm, and a blank film had an absorption of 12.0%. Accordingly, this polymer had a non-transmission index of 3.0.

This film was seen to be colored blue and had red fluorescence. Stronger light was seen at the cross section of the film than at its surface. Measurement of the fluorescence spectrum of this film showed that it absorbed light in the vicinity of 600 nm and converted it to light in the vicinity of 640 nm.

The radiation energy of this film upon the transmission of sunlight therethrough was measured. It was found that the film emitted greater energy than natural sunlight in the emission area, and the efficiency of light conversion at one surface of this film was about 12% in terms of an energy unit.

EXAMPLE 2

One thousand parts of polyethylene terephthalate chips (Tetoron chips, a product of Teijin Limited) and 1 part of CI Vat Orange 9, a pyranthrone fluorescent substance, were dry-blended, and injection-molded at 300° C. to form a plate having a thickness of 1 mm, a length of 11 cm and a width of 10 cm. This plate was found to emit strong green fluorescence particularly at its side surfaces, that is, a 1 mm×10 cm surface and a 1 mm×11 cm surface. The plate had a non-transmission index of 1.5.

EXAMPLE 3

A plate having a thickness of 1 mm was produced in the same way as in Example 2 except that CI Vat Violet 10, an isodibenzanthrone fluorescent substance, was used instead of CI Vat Orange 9. This plate had red fluorescence near 620 nm, and a non-transmission index of 1.8.

COMPARATIVE EXAMPLE 1

A plate having a thickness of 1 mm was produced in the same way as in Example 3 except that 30 parts of CI Vat Violet 10 was used. The plate had a non-transmission index of 28, and pigment particles were seen to remain therein when observed with the naked eyes.

EXAMPLE 4

A plate having a thickness of 1 mm was produced in the same way as in Example 2 except that 0.08 part of CI Vat Red 41 and 0.05 part of CI Vat Violet 10 were used. The plate showed strong red light on a 1 mm × 10 cm surface and a 1 mm × 11 cm surface which were side surfaces. The plate had a non-transmission index of 2.0.

EXAMPLE 5

Polyethylene terephthalate dry-blended with the same fluorescent substances in the same proportions as in Example 4 was melt-extruded at 300° C. to form a round rod having a diameter of 1 mm. The rod had strong red light in its circular cross section.

EXAMPLES 6 TO 8 AND COMPARATIVE EXAMPLES 2 AND 3

One part each of the fluorescence substances shown in Table 1 below was added to 1,000 parts of polyethylene terephthalate, and the mixture was melt-extruded into an unstretched film at 300° C. The unstretched film was stretched at 85° C. longitudinally at a stretch ratio of 3.2 and then transversely at a stretch ratio of 3.4, and heat-set at 130° C. to form a biaxially stretched film having a thickness of 100 μm.

The film was exposed to sunlight outdoors, and the decrease of the intensity of the strongest maximum absorption wavelength was measured. The percentage of absorption intensity after exposure based on that before exposure was calculated, and defined as the residual ratio. The results show that the shaped article of the invention had excellent weatherability.

TABLE 1

| | | Residual ratio (%) | |
|---|---|---|---|
| Run | Fluorescent pigment | One month after exposure | Two months after exposure |
| Example 6 | CI Vat Orange 9 | 99.8 | 99.2 |
| Example 7 | CI Vat Blue 20 | 100 | 99.7 |
| Example 8 | CI Vat Violet 10 | 100 | 99.5 |
| Comparative Example 2 | Coumarin 6 | 88.8 | 62.2 |
| Comparative Example 3 | Rhodamine 6G base | 64.2 | 52.1 |

EXAMPLE 9

One thousand parts of polyethylene terephthalate chips (Tetoron chips, a product of Teijin Limited) and 1 part of CI Vat Red 41, a thioindigo pigment, were dry-blended and melted at 300° C. The molten mixture was injection-molded at 300° C. to form a plate having a thickness of 1 mm, a length of 11 cm and a width of 10 cm.

This plate was found to emit strong light near 580 nm especially at its side surfaces, i.e. a 1 mm × 11 cm surface and a 1 mm × 10 cm surface. The plate had a non-transmission index of 2.3.

EXAMPLES 10 AND 11 AND COMPARATIVE EXAMPLES 4 AND 5

In each run, a plate was produced in the same way as in Example 9 except that CI Vat Red 1 in each of the concentrations shown in Table 2 was used instead of 1 part of CI Vat Red 41.

The plates obtained in Examples 10 and 11 showed strong orange fluorescence near 580 nm particularly at a 1 mm × 11 cm surface and a 1 mm × 10 cm surface.

The non-transmission indices, percent absorptions at 600 nm and fluorescence spectra excited with light having a wavelength of 450 nm falling upon the plates at an incidence angle of 45°, of these plates were measured. The fluorescence intensities shown in Table 2 are relative values obtained by taking the fluorescence intensity of the plate in Example 10 as 1.0.

It is seen that when the fluorescent pigment was incorporated in a concentration of 0.5% by weight, the plate showed a decreased fluorescence intensity despite its low non-transmission index, showing concentration quenching.

By visual observation, coloration evidently increased intensity as the concentration of the fluorescent pigment increased.

TABLE 2

| Run | Concentration of CI Vat Red 1 (% by weight) | Non-transmission index | Percent absorption (%) | Fluorescence intensity |
|---|---|---|---|---|
| Example 10 | 0.1 | 2.0 | 32 | 1.0 |
| Example 11 | 0.2 | 3.0 | 45 | 1.4 |
| Comparative Example 4 | 0.5 | 13.0 | 74 | 0.5 |
| Comparative Example 5 | 0.8 | 65.0 | >100 | 0.1 |

EXAMPLE 12

A plate was produced in the same way as in Example 9 except that 0.5 part of 12H-phthaloperin-12-one was used instead of CI Vat Red 41.

This plate had strong greenish blue fluorescence near 480 nm, and a non-transmission index of 1.0.

EXAMPLE 13

A plate was produced in the same way as in Example 12 except that 0.5 part of CI Vat Orange 7 was used instead of 12H-phthaloperin-12-one. This plate had strong yellow fluorescence near 550 nm and a non-transmission index of 1.2.

COMPARATIVE EXAMPLE 6

A plate was produced in the same way as in Example 12 except that 75 parts of CI Vat Orange 7 was used. This plate scarcely had fluorescence and was nontransparent. It had a non-transmission index of 86.2, and pigment particles were seen to remain even by observation with the naked eyes.

EXAMPLE 14

A plate was produced in the same way as in Example 13 except that 0.5 part of CI Vat Red 15 was used instead of CI Vat Orange 7. This plate had strong orange fluorescence.

EXAMPLE 15

One thousand parts of polyethylene terephthalate chips and 2 parts of CI Vat Red 41 were dry-blended and melted at 300° C., and formed into an unstretched film having a thickness of 450 μm in a customary manner.

The film was stretched consecutively at 85° C. at a stretch ratio of 3 both in the longitudinal and transverse directions to give a stretched film having a thickness of 50 μm.

A film having a thickness of 1 mm obtained from the above dry blend had a non-transmission index of 1.3.

When the radiation energy of this film upon transmission of sunlight therethrough was measurdd, it was found that the film emitted greater energy than natural sunlight in the emission region. The light conversion efficiency of this film at its one surface was about 9% in terms of an energy unit.

EXAMPLE 16

A film having a thickness of 50 μm was produced in the same way as in Example 15 except that 1.5 parts of CI Vat Orange 7 was used instead of CI Vat Red 41. A film having a thickness of 1 mm prepared from the polymer blend had a non-transmission index of 1.5. The film having a thickness of 50 μm emitted greater energy than natural sunlight in the emission range, and the efficiency of light conversion at its one surface was about 7%.

EXAMPLE 17

One thousand parts of polyethylene terephthalate chips and 0.5 parts of CI Vat Red 1 were dry-blended and melt-extruded at 300° C. into a rod having a diameter of 1 mm.

This rod was seen to emit strong orange light from its cross section.

EXAMPLES 18 TO 22

One thousand parts of polyethylene terephthalate was admixed with one part each of the fluorescent substances shown in Table 3, and the mixture was melt-extruded at 300° C. into an unstretched film. The unstretched film was consecutively stretched at 85° C. at a stretch ratio of 3.2 in the longitudinal direction and at a stretch ratio of 3.4 in the transverse direction, and then heat-set at 130° C. for 10 seconds to give a biaxially stretched film having a thickness of 100 μm.

The film was exposed to sunlight outdoors, and the decrease of the intensity of its strongest maximum absorption wavelength was measured. The percentage of the absorption intensity after exposure based on the absorption intensity before exposure was calculated, and defined as the residual ratio.

The results show that the shaped articles in accordance with this invention have excellent weatherability.

TABLE 3

| | | Residual ratio (%) | |
|---|---|---|---|
| Example | Fluorescent substances | One month after exposure | Two months after exposure |
| 18 | CI Vat Orange 7 | 100 | 99.1 |
| 19 | 12H-phthaloperin-12-one | 99.8 | 98.4 |
| 20 | CI Vat Red 41 | 100 | 99.3 |
| 21 | CI Vat Red 1 | 99.2 | 96.9 |

TABLE 3-continued

| | | Residual ratio (%) | |
|---|---|---|---|
| Example | Fluorescent substances | One month after exposure | Two months after exposure |
| 22 | CI Pigment Red 88 | 100 | 99.8 |

EXAMPLE 23

One thousand parts of bisphenol A-type polycarbonate chips (Panlite, a product of Teijin Chemical Co., Ltd.) and 1 part of CI Vat Orange 7 were dry-blended and melted at 300° C., and injection-molded into a plate having a thickness of 1 mm. The plate had a length of 10 cm and a width of 11 cm. This plate showed yellow fluorescence, and emitted strong light at its side surfaces, especially a 1 mm×10 cm surface and a 1 mm×11 cm surface. Its fluorescence spectrum showed that light having a wavelength of about 460 nm was converted to light having a wavelength of about 550 nm. The plate had an absorption of 11.3% near 550 nm, and a blank plate had an absorption of 11.0%. The plate had a non-transmission index of 0.3.

EXAMPLE 24

A plate emitting orange fluorescence near 590 nm was produced in the same way as in Example 23 except that 1 part of CI Vat Red 41 was used instead of CI Vat Orange 7. The plate had a non-transmission index of 0.0.

EXAMPLE 25

A plate emitting red fluorescence near 620 nm was produced in the same way as in Example 23 except that 0.5 part of CI Vat Violet 10 was used instead of CI Vat Orange 7. This plate had a non-transmission index of 1.2.

EXAMPLE 26

One thousand parts of polycarbonate chips and 0.5 part of CI Vat Red 1 were dry-blended and melt-extruded at 300° C. to produced a rod having a diameter of 1 mm. The rod had strong orange light in its cross section.

A plate produced from the above blend in the same way as in Example 23 had a non-transmission index of 2.9, and was seen to emit strong orange light having a wavelength of 580 nm at a 1 mm×10 cm surface and a 1 mm×11 cm surface.

EXAMPLES 27 TO 30 AND COMPARATIVE EXAMPLE 7

One thousand parts of polycarbonate and 1 part of each of the organic fluorescent substances shown in Table 4 were blended and melt-extruded at 300° C. to give a film having a thickness of 50 μm. The film was exposed to sunlight outdoors, and the decrease of the intensity of the strongest maximum absorption wavelength was measured. The percentage of the absorption intensity after exposure based on that before exposure was calculated, and defined as the residual ratio.

The results show that the shaped articles of the invention had superior weatherability.

TABLE 4

| Example | Organic fluorescent substance | Residual ratio (%) One month after exposure | Three months after exposure |
| --- | --- | --- | --- |
| 27 | CI Vat Orange 7 | 100 | 98.8 |
| 28 | CI Vat Red 41 | 100 | 99.1 |
| 29 | CI Pigment Red 88 | 99.8 | 98.9 |
| 30 | CI Vat Violet 10 | 100 | 99.2 |
| Comp. Ex. 7 | Coumarin 6 | 85.5 | 40.0 |

TABLE 5

| Run | Organic fluorescent substance | Residual ratio (%) One month after exposure | Three months after exposure |
| --- | --- | --- | --- |
| Ex. 35 | CI Vat Orange 7 | 99.8 | 99.4 |
| Ex. 36 | CI Vat Red 41 | 99.3 | 99.1 |
| Ex. 37 | CI Vat Violet 10 | 98.5 | 94.8 |
| CEx. 8 | Coumarin 6 | 83.3 | 36.6 |
| CEx. 9 | Rhodamine 6G Base | 85.2 | 55.1 |

EXAMPLE 31

One thousand parts of poly(methyl methacrylate) (Acrypet, a product of Mitsubishi Rayon Co., Ltd.) and 1 part of CI Vat Red 41 were dry-blended, and injection-molded at 255° C. to form a plate having a thickness of 1 mm, a length of 11 cm and a width of 10 cm.

This plate had orange fluorescence, and showed strong fluorescence especially at a 1 mm×10 cm surface and a 1 mm×11 cm surface.

Its fluorescence spectrum showed that it absorbed light having a wavelength of about 550 nm and converted it to light having a wavelength of about 590 nm.

This plate had an absorption of 9.1% at 800 nm, and a blank plate showed an absorption of 8.9%. The plate had a non-transmission index of 0.2.

EXAMPLE 32

A plate was produced in the same way as in Example 31 except that 0.2 part of CI Vat Orange 7 was used instead of CI Vat Red 41. This plate emitted strong yellow light near 550 nm especially at a 1 mm×10 cm surface and a 1 mm×11 cm surface. The plate had a non-transmission index of 0.5.

EXAMPLE 33

A plate was produced in the same way as in Example 1 except that 0.2 part of CI Vat Violet 10 was used. This plate emitted strong red light in the vicinity of 620 nm especially at a 1 mm×10 cm surface and a 1 mm×11 cm surface. The plate had a non-transmission index of 0.4.

EXAMPLE 34

One thousand parts of poly(methyl methacrylate) and 0.5 part of CI Vat Red 1 were dry-blended and melt-extruded at 240° C. to form a rod having a diameter of 2 mm. This rod emitted strong orange light in its circular cross section.

EXAMPLES 35 TO 37 AND COMPARATIVE EXAMPLES 8 AND 9

One thousand parts of poly(methyl methacrylate) and 0.2 part of each of the organic fluorescent substances shown in Table 5 were blended and melt-extruded at 255° C. to form a film having a thickness of 0.1 m. The film was exposed to sunlight outdoors, and the decrease of the intensity of the strongest maximum absorption wavelength was measured. The percentage of the absorption intensity after exposure based on that before exposure was calculated and defined as the residual ratio.

It is seen that the shaped articles in accordance with this invention have excellent weatherability.

EXAMPLE 38

One thousand parts of polystyrene resin (Styron, a product of Asahi Dow Co., Ltd.) and 1 part of CI Vat Red 41 were dry-blended and injection-molded at 300° C. to produce a plate having a thickness of 1 mm, a length of 11 cm and a width of 10 cm. The plate showed a strong emission of orange fluorescence especially at a 1 mm×10 cm surface and a 1 mm×11 cm surface.

Its fluorescene spectrum showed that it absorbed light having a wavelength of about 550 nm and convert it to light having a wavelength of about 590 nm.

The plate had a non-transmission index of 0.5.

EXAMPLE 39

A plate was produced in the same way as in Example 38 except that 0.2 part of CI Vat Orange 7 was used. This plate strongly emitted yellow light especially at a 1 mm×10 cm surface and a 1 mm×11 cm surface. The plate had a non-transmission index of 1.1.

COMPARATIVE EXAMPLE 10

A plate was produced in the same way as in Example 39 except that 15 parts of CI Vat Orange 7 was used instead of CI Vat Red 41. The plate was nontransparent, and pigment particles were seen to remain even by observation with the naked eyes. It had a non-transmission index of 56. It scarcely showed an emission of light at a 1 mm×10 cm surface and a 1 mm×11 cm surface, and showed no light collecting effect.

EXAMPLE 40

A plate was produced in the same way as in Example 38 except that 0.5 part of CI Vat Violet 10 was used instead of CI Vat Red 41. This plate emitted strong red light especially at a 1 mm×10 cm surface and a 1 mm×11 cm surface. The plate had a non-transmission index of 2.1.

EXAMPLE 41

A rod having a diameter of 1 mm was obtained by dry-blending 100 parts of polystyrene with 0.5 part of CI Vat Red 1 and melt-extruding the mixture. The rod emitted strong orange light at its circular cross section.

EXAMPLES 42 TO 44 AND COMPARATIVE EXAMPLE 11

In each run, 1,000 parts of polystyrene was and 0.05 part of each of the organic fluorescent substances shown in Table 6 were blended and melt-extruded at 300° C. to form a film having a thickness of 0.1 mm. The film was exposed to sunlight outdoors, and the decrease of the absorption intensity of the strongest maximum absorption wavelength was measured. The percentage of the absorption intensity after exposure based on that before exposure was calculated, and defined as the residual ratio.

It is seen that the shaped articles of the invention have excellent weatherability.

TABLE 6

| Example | Organic fluorescent substance | Residual ratio (%) | |
|---|---|---|---|
| | | One month after exposure | Three months after exposure |
| 42 | CI Vat Orange 7 | 99.9 | 99.2 |
| 43 | CI Vat Red 41 | 99.5 | 98.9 |
| 44 | CI Vat Violet 10 | 99.1 | 92.9 |
| Comp. Ex. 11 | Coumarin 6 | 80.1 | 29.9 |

EXAMPLE 45

One thousand parts of polyethylene terephthalate chips (Tetoron chips) and 0.5 part of CI pigment Red 149 were dry-blended and melt-extruded at 300° C. to form an unstretched film having a thickness of about 1 mm. A film having a thickness of 1 mm obtained from the above dry blend had a non-transmission index of 1.5.

The unstretched film was stretched consecutively at 85° C. at a stretch ratio of 3.2 both in the longitudinal and transverse directions to form a film having a thickness of 0.1 mm.

This film had yellow fluorescence having a maximum value at 542 nm, 581 nm and 630 nm. When its radiation energy upon transmission of sunlight was measured, it absorbed light having a wavelength of about 460 nm and 540 nm and generated greater energy than natural sunlight in the emission region. The efficiency of light conversion of this film at its one surface was about 13% in terms of an energy unit.

EXAMPLE 46

One thousand parts of polycarbonate pellets (Panlite, a product of Teijin Chemical Co., Ltd.) and 0.5 part of CI Pigment Red 123 were dry-blended and melted at 300° C., and formed into a film having a thickness of 1 mm in a customary manner. This film had a non-transmission index of 1.0.

The film had yellow fluorescence having a maximum value at 544 nm, 582 nm and 630 nm.

EXAMPLE 47

One thousand parts of polystyrene (Styron, a product of Asahi Dow Co., Ltd.) and 0.5 part of CI pigment Red 179 were dry-blended and melted at 280° C. and formed into a film having a thickness of 1 mm in a customary manner. The film had a non-transmission index of 1.2.

The film had yellow fluorescence in the vicinity of 543 nm, 580 nm and 620 nm.

EXAMPLE 48

One thousand parts of poly(methyl methacrylate) pellets (Acrypet, a product of Mitsubishi Rayon Co., Ltd.) and 0.1 part of CI Pigment Red 189 were dry-blended and melted at 255° C. and formed into a film having a thickness of 1 mm in a customary manner. The film had a non-transmission index of 1.8. This film had yellow fluorescence having a maximum in the vicinity of 543 nm, 582 nm and 630 nm.

COMPARATIVE EXAMPLE 12

One thousand parts of polyethylene chips (Sumikathene, a product of Sumitomo Chemical Co., Ltd.) and 0.5 part of CI Pigment Red 149 were dry-blended and formed into a film having a thickness of 1 mm at 300° C. This film had a non-transmission index of 18 and scarcely emitted fluorescence. The presence of pigment particles remaining therein was noted by observation with the naked eyes.

EXAMPLE 49 AND COMPARATIVE EXAMPLES 13 AND 14

The film prepared in Example 45, a polyethylene terephthalate film containing 0.1% by weight of Coumarin 6, and a polyethylene terephthalate film containing 0.4% by weight of Rhodamine 6G Base were each exposed to sunlight outdoors, and after 3 months' exposure the degree of color fading was measured at 532 nm for CI Pigment Red 149, 460 nm for Coumarin 6, and 530 nm for Rhodamine 6G Base. The results are shown in Table 3.

TABLE 7

| Run | Fluorescent substance | Degree of color fading (%) |
|---|---|---|
| Example 49 | CI Pigment Red 149 | 0.5 |
| Comp. Ex. 13 | Coumarin 6 | 63.4 |
| Comp. Ex. 14 | Rhodamine 6G Base | 38.5 |

EXAMPLE 50

One thousand parts of polyethylene terephthalate chips (Tetoron chips), 1.5 parts of CI Vat Orange 7 and 3 parts of CI Vat Red 43 were dry-blended, melted at 300° C., and formed into an unstretched film having a thickness of 450 $\mu$m in a customary manner. The film was stretched at 85° C. consecutively in the longitudinal and transverse directions at a stretch ratio of 3 to give a stretched film having a thickness of 50 $\mu$m.

A film having a thickness of 1 mm prepared from the dry blend had a non-transmission index 1.2.

This film had an absorption of 11.6% at 800 nm, and a blank film had an absorption of 8.6%. The film thus had a non-transmission index of 3.0.

The fluorescence spectrum of this film showed that the excited spectrum is a combination of the spectra of the two fluorescent substances. The fluorescent spectrum excited by light having a wavelength of 460 nm (which is the absorption maximum wavelength of CI Vat Orange 7) falling upon the film at an incidence angle of 45° did not show an emission of CI Vat Orange 7 having a maximum value near 550 nm, but showed an emission of CI Vat Red 41 alone which has a maximum value near 595 nm.

When the radiation energy of this film upon transmission of sunlight therethrough was measured, it was found that it absorbed light having a wavelength of about 400 nm to about 550 nm and emitted greater energy than natural sunlight in the emission region near 600 nm.

COMPARATIVE EXAMPLE 15

One thousand parts of polyethylene terephthalate chips, 15 parts of CI Vat Orange 7 and 30 parts of CI Vat Red 41 were dry-blended, melted at 300° C., and formed into an unstretched film having a thickness of 450 $\mu$m. The unstretched film was stretched at 85° C. and a stretch ratio of 3 both longitudinally and transversely to give a film having a thickness of 50 $\mu$m. A film having a thickness of 1 mm prepared from the above dry blend had a non-transmission index of 83, and its fluorescence was hardly seen owing to concentration quenching.

COMPARATIVE EXAMPLE 16

One thousand parts of low-density polyethylene (Sumikathene G8-6, a product of Sumitomo Chemical Co., Ltd.), 1.5 parts of CI Vat Orange 7 and 3 parts of CI Vat Red 41 were dry-blended, and formed at 300° C. into a film having a thickness of 1 mm. The film had a non-transmission index of 31 and scarcely emitted fluorescence. The remaining of pigment particles therein was ascertained even by the naked eyes.

EXAMPLE 51

One thousand parts of Tetoron chips, 0.75 part of CI Vat Orange 7 and 1.5 parts of CI Vat Red 41 and 0.5 part of CI Vat Violet 10 were dry-blended, melted at 300° C., and formed into an unstretched film having a thickness of 1 mm. The unstretched film was consecutively stretched at 85° C. and a stretch ratio of 3 both longitudinally and transversely to give a film having a thickness of about 130 μm. The unstretched film had a non-transmission index of 3.1.

COMPARATIVE EXAMPLE 17

One thousand parts of Tetoron chips, 0.032 part of CI Vat Orange 7, 0.065 part of CI Vat Red 41 and 0.022 part of CI Vat Violet 10 were dry-blended, and formed into an unstretched sheet having a thickness of 3 mm in the same way as in Example 51.

The fluorescence spectrum of each of the samples of Example 51 and Comparative Example 17 obtained by excitation with exciting light of 460 nm showed that substantially only the emission of CI Vat Violet 10 was noted, and in spite of the equal number of fluorescent substances in the path of the exciting light, the film of Example 1 evidently converted wavelengths with better efficiency than the sheet of Comparative Example 15, and the ratio of the areas of emitting surfaces at more than 600 nm was 5.9.

EXAMPLE 52

One thousand parts of poly (methyl methacrylate Acrypet), 1 part of Coumarin 6 and 2 parts of CI Vat Red 1 were dry-blended, melt-extruded at 240° C. and cut into chips.

Seven parts of the chips were dissolved in chloroform, and the solution was cast on a glass plate and dried to give a film having a thickness of 7 μm. The film was exposed to sunlight outdoors, and the degree of color fading was determined from the absorption of Coumarin 6 at 460 nm, and the absorption of CI Vat Red 1 at 540 nm, respectively. It was 14.0%, and 2.7%, respectively.

COMPARATIVE EXAMPLE 18

Poly(methyl methacrylate) (7 parts), 0.014 part of Coumarin and 0.014 part of Rhodamine 6G were dissolved, and the solution was formed into a film having a thickness of 7 μm in the same way as in Example 52. The film was exposed to sunlight outdoors for one month, and the degree of color fading was determined at 460 nm for Coumarin 6 and 535 nm for Rhodamine 6G, respectively. It was 91.0%, and 71.5%, respectively.

EXAMPLE 53

One thousand parts of bisphenol A-type polycarbonate chips (Panlite, a product of Teijin Chemical Co., Ltd.), 0.75 part of CI Vat Orange 7, 1.5 parts of CI Vat Red 41, and 0.5 part of CI Vat Violet 10 were dry-blended, melted at 300° C., and injection-molded into a plate having a thickness of 1 mm.

This plate was excited with light having a wavelength of 400 nm. The fluorescence spectrum of it showed only an emission of CI Vat Violet 10. The plate and a non-transmission index of 2.0.

EXAMPLE 54

A plate having a thickness of 1 mm was produced in the same way as in Example 53 except that AS resin (acrylonitrile/styrene copolymer; "TAIRIRU" made by Asahi Dow Co., Ltd.). The plate had a non-transmission index of 2.8. In this case, only the emission of CI Vat Violet 10 was observed.

EXAMPLE 55

Polyethylene terephthalate films (0.13 mm×1 cm×2 cm, and 0.13 mm×2 cm×4 cm) containing 0.3% by weight of 12-H-phthaloperinone were each optically coupled to a monocrystal silicon solar cell 2T-207 (1 cm×2 cm; a product of Solarex Company) by means of a silicone oil having a refractive index of 1.51. Light was irradiated on it from a solar simulator (xenon light source, Air Mass 1 filter; made by Oliel Company). The 1 cm×2 cm film showed a conversion efficiency of 8.8%, and the 2 cm×4 cm film showed a conversion efficiency of 9.4%. Blank films showed a conversion efficiency of 8.6%.

EXAMPLES 56 TO 59 AND COMPARATIVE EXAMPLE 19

In each run, a polyethylene terephthalate film (0.13 mm thick) containing each of the vat pigments shown in Table 8 was bonded to a poly(methyl methacrylate) plate (3 mm in thickness) by means of a polyester resin ("BAIRON", a product of Toyo Spinning Co., Ltd.) to make a solar concentrator (6 cm×6 cm). A silicon solar cell was coupled to each of four edges of the solar concentrator by means of a silicone oil. Xenon light was irradiated to the 6 cm×6 cm surface, and the short-circuit current (mA) was measured by the solar cell at one of its edge surfaces.

TABLE 8

| Example | Vat pigment | Concentration (%) | Short-circuit current (mA) |
| --- | --- | --- | --- |
| 56 | CI Vat Orange 7 | 0.1 | 13.0 |
| 57 | CI Vat Orange 7 | 0.15 | 13.1 |
| 58 | CI Vat Violet 10 | 0.05 | 10.8 |
| 59 | CI Vat Orange 7 | 0.1 | 15.0 |
|  | CI Vat Red 32 | 0.05 |  |
| Comp. Example 19 | Blank film | — | 2.2 |

EXAMPLE 60

Polyethylene terephthalate chips were dry-blended with CI Pigment Red 88 in each of the concentrations shown in Table 9, and the blend was formed into an unstretched film having a thickness of about 1 mm in a customary manner at 300° C. and with a residence time of 3 minutes. The non-transmission index PTi of the film was determined. The film was successively stretched biaxially to form a film having a thickness of 0.13 mm. The film was bonded to a polyethylene terephthalate sheet having a thickness of 3 mm by means of a polyester resin ("BAIRON", a product of Toyo Spinning Co., Ltd.), to make a solar concentrator (6 cm×6 cm). Light from a xenon lamp was irradiated to a 2 cm×6 cm portion of the bottom of this plate, and silicon solar cells were optically coupled to the edges of its top portion, and the short circuit current (mA) was measured.

TABLE 9

| Concentration (%) | PTi | Short-circuit current (mA) |
|---|---|---|
| 0.1 | 0.9 | 3.2 |
| 0.3 | 5.2 | 3.8 |
| 0.5 | 18.1 | 2.5 |
| 0.7 | 87.9 | 1.5 |
| Blank | — | 0.4 |

EXAMPLE 61

A polyethylene terephthalate film (0.14 mm in thickness) containing 0.05% of 12-H-phthaloperinone, 0.05% of CI Vat Orange 7 and 0.1% of CI Vat Red 1 was bonded to a polyethylene terephthalate sheet (3 mm in thickness) by means of a polyester resin to make a solar concentrator (6 cm×6 cm). Then, a polyethylene terephthalate film (0.1 mm in thickness) was bonded to a polyethylene terephthalate sheet (3 mm in thickness) containing 0.00233% of 12-H-phthaloperinon 0.00233% of CI Vat Orange 7 and 0.00467% of CI Vat Red 1 by means of a polyester resin to make a solar concentrator (6 cm×6 cm). These concentrators contained the same amounts of fluorescent substances per unit area in the thickness direction.

A silicon solar cell was optically coupled to one of the edge portions of each of these solar concentrators by means of a silicone oil, and light from a xenon lamp was irradiated to the 6 cm×6 cm surface, and the short-circuit current was measured. The light from the xenon lamp was passed through a filter (Toshiba Color Glass C-39A) to irradiate light having a wavelength of about 400 nm which was absorbed substantially only by 12-H-phthaloperinone and light having a wavelength longer than 700 nm which none of the vat pigments could absorb. The short-circuit current was 3.8 mA in the case of the former and 3.0 mA in the case of the latter.

A blank, which was obtained by simply bonding the polyethylene terephthalate film to the polyethylene terephthalate sheet, showed a short-circuit current of 1.8 mA.

What we claim is:

1. A fluorescent composition consisting essentially of
(1) a polymer having a solubility parameter of at least about 9, and
(2) one or more organic fluorescent substances, at least one of said fluorescent substances being selected from the group consisting of dibenzanthrone pigments, isodibenzanthrone pigments, dibenzopyrenequinone pigments, anthanthrone pigments, perinone pigments, and perylene pigments and showing difficult solubility such that when 0.5 part by weight of said at least one fluorescent substance and 100 parts by weight of polypropylene are mixed in the molten state at 300° C. for 10 minutes and formed into a film having a thickness of about 1 mm, the film has a non-transmission index ETi (%), as defined by the following equation, of at least 7, ETi=EAs−EAb wherein EAs is the percent light absorption of said film at 800 nm, and EAb is the percent light absorption at 800 nm of a film of polypropylene having a thickness of about 1 mm, said fluorescent composition being characterized by the fact that when it is formed into a film having a thickness of about 1 mm, the film has a non-transmission index PTi (%), as defined by the following equation, of not more than 10, PTi=PAs−PAb wherein PAs is the percent light absorption at 800 nm of said film of the fluorescent composition, and PAb is the percent light absorption at 800 nm of a film having a thickness of about 1 mm of the polymer in the fluorescent composition.

2. The composition of claim 1 wherein the polymer having a solubility parameter of at least about 9 is a thermoplastic resin, and the fluorescent composition is thermoplastic.

3. The composition of claim 1 wherein the polymer having a solubility parameter of at least about 9 is a curable resin before curing, and the fluorescent composition is cured.

4. The composition of any one of claims 1 to 3 which contains only one of said organic fluorescent substances having a non-transmission index Eti (%) of at least about 7.

5. The composition of any one of claims 1 to 3 which contains at least two organic fluorescent substances having an ETi (%) of at least about 7, in which the emission spectrum of one organic fluorescent substance does not substantially have a wavelength common to the absorption spectrum of another organic fluorescent substance.

6. The composition of any one of claims 1 to 3 which contains at least two organic fluorescent substances, wherein at least one of them has a non-transmission index ETi (%) of at least about 7, and in at least two of them, the emission spectrum of one organic fluorescent substance has a wavelength common to the absorption spectrum of another organic fluorescent substance.

7. The composition of claim 6 which contain at least two organic fluorescent substances having a non-transmission index ETi (%) of at least about 7, wherein in at least two of them, the emission spectrum of one organic fluorescent substance has a wavelength common to the absorption spectrum of another organic fluorescent substance.

8. The composition of claim 7 which contains at least two organic fluorescent substances having a non-transmission index ETi (%) of at least about 7, in all of which the emission spectrum of one organic fluorescent substance has a wavelength common to the absorption spectrum of another organic fluorescent substance.

9. The composition of claim 1 wherein the polymer having a solubility parameter of at least about 9 is poly(methyl methacrylate), polymethyl acrylate, polyvinyl acetate, polystyrene, polyvinyl chloride, polyvinylidene chloride, polyacrylonitrile, cellulose acetate, polyethylene terephthalate, polyethylene isophthalate, polyethylene naphthalate, polytrimethylene terephthalate, polypropylene terephthalate, polytetramethylene terephthalate, polyhexamethylene sebacamide, poly(ω-undecanamide), poly(ω-dodecanamide), bisphenol-type polycarbonate, polyphenylmethylsiloxane, or polydiphenylsiloxane.

10. The composition of claim 1 wherein the total concentration of the organic fluorescent substances is not more than about 3% by weight based on the composition.

11. The fluorescent composition of claim 10 wherein the total concentration of the organic fluorescent substances is not more than about 2.5% by weight.

12. The composition of claim 1 wherein the concentration of any one of the organic fluorescent substances is at least about 0.001% by weight based on the composition.

13. The composition of claim 12 wherein the concentration of any one of the organic fuuorescent substances is at least about 0.005% by weight based on the composition.

14. The composition of claim 1 which contains at least two organic fluorescent substances, at least one of which has a non-transmission index $ET_i$ (%) of at least about 7, and at least two of which are such that the emission spectrum of one organic fluorescent substance has a wavelength common to the absorption spectrum of another organic fluorescent substance, the total concentration of said organic fluorescent substances being not more than about 3% by weight based on the composition, and the concentration of each of said organic fluorescent substances being at least about 0.001% by weight, and the total concentration of any two organic fluorescent substances having the common wavelength being at least about 0.004% by weight based on the composition.

15. The composition of claim 14 wherein the total concentration of said two organic fluorescent substances having the common wavelength is at least about 0.01% by weight based on the composition.

16. The composition of claim 1 wherein the fluorescent substance is at least one pigment selected from the group consisting of dibenzathrone pigments, isodibenzanthrone pigments, dibenzopyrenequinone pigments and anthanthrone pigments.

* * * * *